US008248816B2

(12) United States Patent
Fung

(10) Patent No.: US 8,248,816 B2
(45) Date of Patent: Aug. 21, 2012

(54) METHODS OF DESIGNING MULTILAYER CIRCUITRY, MULTILAYER CIRCUIT DESIGN APPARATUSES, AND COMPUTER-USABLE MEDIA

(75) Inventor: Pat Fung, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1059 days.

(21) Appl. No.: 11/591,021

(22) Filed: Oct. 31, 2006

(65) Prior Publication Data

US 2008/0101050 A1    May 1, 2008

(51) Int. Cl.
*H05K 1/14* (2006.01)

(52) U.S. Cl. ........ 361/794; 361/760; 361/761; 174/255; 174/262

(58) Field of Classification Search .......... 361/780–794; 174/250, 255, 258, 262, 251; 257/666, 692, 257/698, 700, 758, 775; 333/33
See application file for complete search history.

(56) References Cited

U.S. PATENT DOCUMENTS

| 4,680,633 | A  | * | 7/1987  | Gerdes et al.      | 348/526  |
|-----------|----|---|---------|--------------------|----------|
| 6,259,039 | B1 | * | 7/2001  | Chroneos et al.    | 174/263  |
| 6,441,319 | B1 | * | 8/2002  | Handforth et al.   | 174/262  |
| 6,580,619 | B2 | * | 6/2003  | Schoenborn         | 361/780  |
| 6,639,154 | B1 | * | 10/2003 | Cartier et al.     | 174/255  |
| 6,876,085 | B1 | * | 4/2005  | Handforth et al.   | 257/775  |
| 7,045,719 | B1 | * | 5/2006  | Alexander et al.   | 174/262  |
| 7,220,287 | B1 | * | 5/2007  | Wyrzykowska et al. | 29/25.03 |
| 7,348,494 | B1 | * | 3/2008  | Handforth et al.   | 174/260  |
| 2003/0091730 | A1 | * | 5/2003  | Jessep et al.    | 427/97   |
| 2004/0094328 | A1 | * | 5/2004  | Fjelstad et al.  | 174/251  |
| 2005/0011675 | A1 | * | 1/2005  | Barr et al.      | 174/262  |
| 2005/0011676 | A1 | * | 1/2005  | Barr et al.      | 174/262  |
| 2005/0161254 | A1 | * | 7/2005  | Clink et al.     | 174/262  |
| 2006/0024984 | A1 | * | 2/2006  | Cohen et al.     | 439/61   |
| 2006/0118332 | A1 | * | 6/2006  | Benham           | 174/262  |
| 2006/0151869 | A1 | * | 7/2006  | Gisin et al.     | 257/698  |
| 2006/0237227 | A1 | * | 10/2006 | Zhao et al.      | 174/262  |
| 2007/0008049 | A1 | * | 1/2007  | Dyckman et al.   | 333/33   |
| 2007/0075405 | A1 | * | 4/2007  | Ye               | 257/666  |

\* cited by examiner

*Primary Examiner* — Xiaoliang Chen

(57) ABSTRACT

A method of creating a layout geometry for a multilayer printed circuit board is described. The method involves identifying a signal trace connected to a connector pin via. A antipad is selected for use in conjunction with the connector pin via, where the antipad is of a size selected to prevent interference with said signal trace.

10 Claims, 8 Drawing Sheets

Printed Circuit Board 200
(Ground Plane 205)

System 112

Printed Circuit Board 200
(Top Layer 201)

Printed Circuit Board 200
(Power Layer 202)

Flowchart 800

METHODS OF DESIGNING MULTILAYER CIRCUITRY, MULTILAYER CIRCUIT DESIGN APPARATUSES, AND COMPUTER-USABLE MEDIA

BACKGROUND

In many applications, it is often desirable or necessary to connect several printed circuit boards, or PCBs, together. Such connections are often accomplished using a "through hole" connection, or connector pin via. A pin on the first board is inserted into this via on the second board, which allows signals to travel between the two boards. Two types of these connector pins are commonly used. The first, a press fit connector, is inserted into the via and physically or electrically makes contact with the "barrel" of the via; e.g., a friction fit. The second type is a soldering connection, where the pin is inserted into the via and solder is used to both fill the remaining space and to provide a connection between the pin and the barrel of the via.

Because of the physical structure of such a through hole connection, a connector pin via will often develop a parasitic capacitance. This, in turn, creates a constraint on transmissions that passes through the via. The characteristic impedance of the via is lower than that of signal traces, which creates an impedance discontinuity of the transmission line, with resulting degradation of available bandwidth due to a low pass filter effect of the via capacitance. The result is a reduction in the data rates that can pass through the connection.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
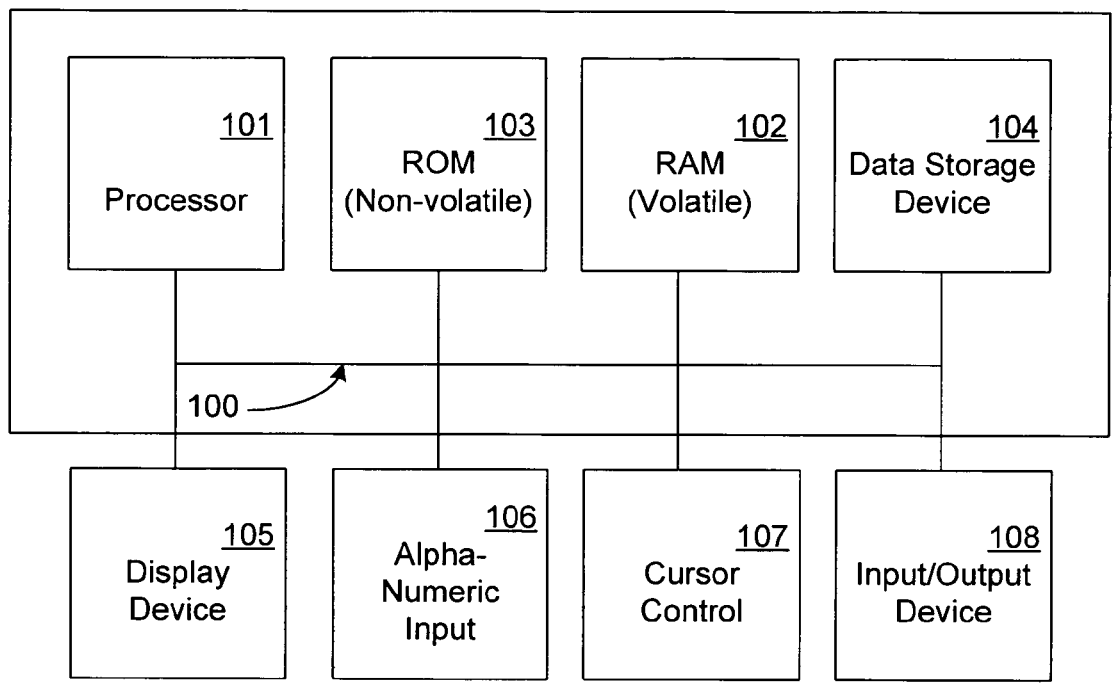
FIG. 1 depicts an exemplary computer system.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 8) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computing devices, typically include at least some form of computer readable media. Computer readable media can be any available media that can be accessed by a computing device. By way of example, and not limitation, computer readable medium may comprise computer storage media and communication media. Computer storage media includes volatile and nonvolatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, or any other medium which can be used to store the desired information and which can be accessed by a computing device. Communication media typically embodies computer readable instructions, data structures, program modules, or other data in a modulated data signals such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

Some embodiments may be described in the general context of computer-executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Basic Computing System

Referring now to FIG. 1, a block diagram of an exemplary computer system 112 is shown. It is appreciated that computer system 112 described herein illustrates an exemplary configuration of an operational platform upon which embodiments may be implemented to advantage. Nevertheless, other computer systems with differing configurations can also be used in place of computer system 112 within the scope of the present invention. That is, computer system 112 can include elements other than those described in conjunction with FIG. 1. Moreover, embodiments may be practiced on any system which can be configured to enable it, not just computer systems like computer system 112. It is understood that embodiments can be practiced on many different types of computer system 112. Examples include, but are not limited to, desktop computers, workstations, servers, media servers, laptops, gaming consoles, digital televisions, PVRs, and personal digital assistants (PDAs), as well as other electronic devices with computing and data storage capabilities, such as wireless telephones, media center computers, digital video recorders, digital cameras, and digital audio playback or recording devices.

Computer system 112 comprises an address/data bus 100 for communicating information, a central processor 101 coupled with bus 100 for processing information and instructions; a volatile memory unit 102 (e.g., random access memory [RAM], static RAM, dynamic RAM, etc.) coupled with bus 100 for storing information and instructions for central processor 101; and a non-volatile memory unit 103 (e.g., read only memory [ROM], programmable ROM, flash memory, etc.) coupled with bus 100 for storing static information and instructions for processor 101. Computer system 112 may also comprise an optional display device 105 coupled to bus 100 for displaying information to the computer user. Moreover, computer system 112 also comprises a data storage device 104 (e.g., hard disk drive) for storing information and instructions.

Computer system 112 also comprises an optional alphanumeric input device 106, an optional cursor control or directing device 107, signal communication interface (input/output device) 108, and video processor 109. Optional alphanumeric input device 106 can communicate information and command selections to central processor 101. Optional cursor control or directing device 107 is coupled to bus 100 for communicating user input information and command selections to central processor 101. Signal communication interface (input/output device) 108, which is also coupled to bus 100, can be a serial port. Communication interface 108 may also include wireless communication mechanisms. Using communication interface 108, computer system 112 can be communicatively coupled to other computer systems over a communication network such as the Internet or an intranet (e.g., a local area network), or can receive data (e.g., a digital television signal). In some embodiments, video processor 109 is incorporated into central processor 101. In other embodiments, video processor 109 is a separate, discrete component. In other embodiments, video processor 109 is incorporated into another component. In other embodiments, video processor 109 is included in system 112 in other ways.

Adaptive Antipads for Printed Circuit Boards

One approach to reduce the parasitic capacitance associated with a connector pin via is to use an antipad around the hole. The larger the antipad, the greater the benefit, in terms of bandwidth. Balancing against this interest, however, is the desire to have ground planes both above and below signal traces running to the connector pin via.

Embodiments address these constraints, by allowing the size of the antipad, that is, the clearance around a connector pin via, to vary on different layers of a multilayer printed circuit board. Unlike existing approaches, the size of the antipad around a connector pin via on a given layer can be adaptively changed during the layout process. In some embodiments, the size of the antipad used will depend upon the presence and location of signal traces adjacent to the ground planes. In some embodiments, it is therefore possible for a connector pin via, which passes through many layers of a multilayer printed circuit board, to have different size antipads associated with it, on different layers of the printed circuit board. This is illustrated in greater detail below.

With reference now to FIGS. 2, 3, 4, 5, 6, and 7, a number of views of an exemplary printed circuit board 200 are depicted, in accordance with one embodiment. While PCB 200 is shown as having a particular layout geometry, and specific enumerated components, is understood that PCB 200 is intended to be exemplary in nature only. Other embodiments are well suited for a broad range of applications, e.g., across many different types of printed circuit boards with different layouts, numbers of layers, or components.

Figure 2:
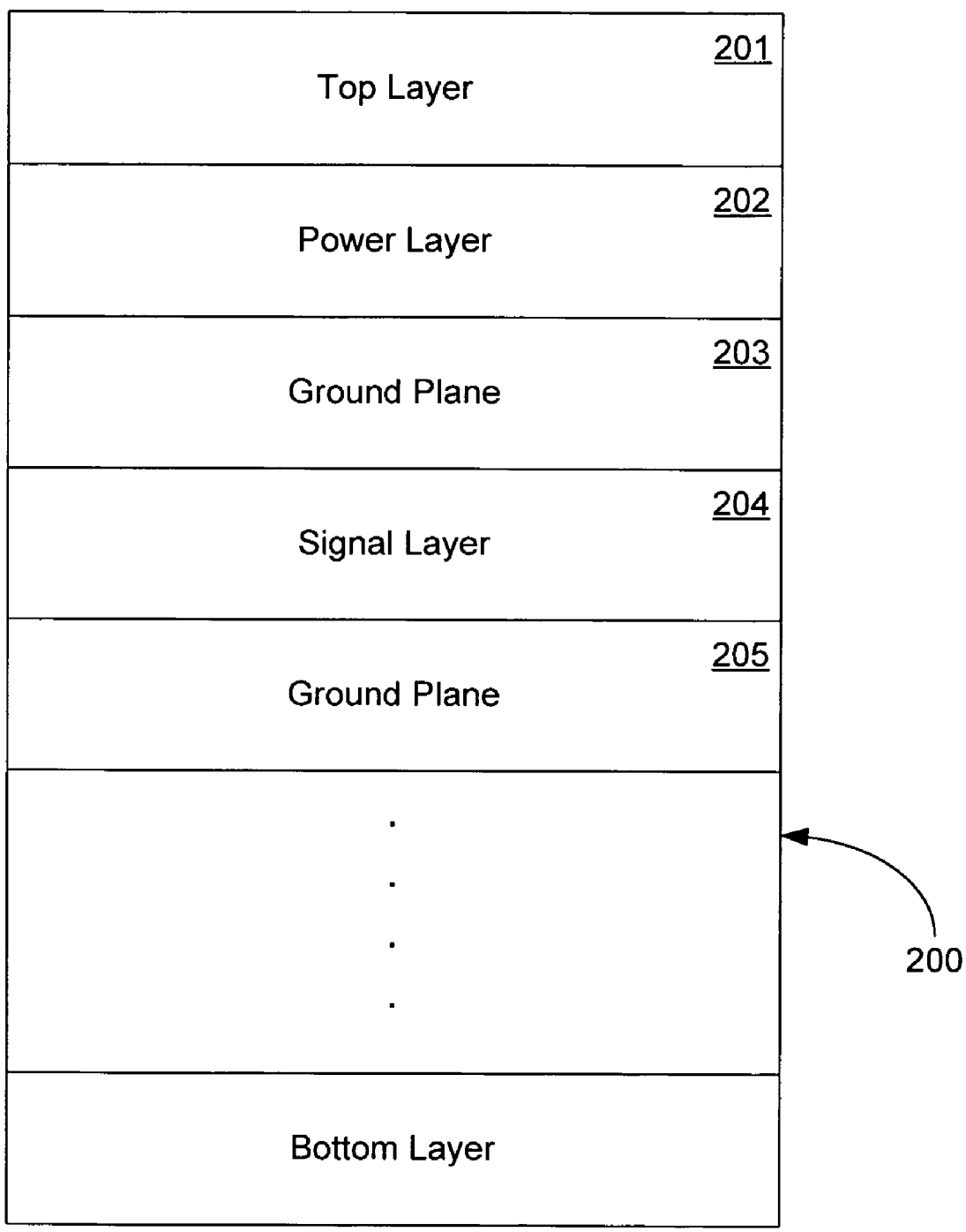
FIG. 2 depicts a layered view of a multilayer printed circuit board, in accordance with embodiments.

With reference now to FIG. 2, an illustration of the multilayered nature of PCB 200 is depicted, in accordance with one embodiment. PCB 200 is shown as comprising a top layer 201, a power layer 202, a ground plane 203, a signal layer 204, and a second ground plane 205. The number of layers and their ordering may change across different embodiments.

Figure 3:
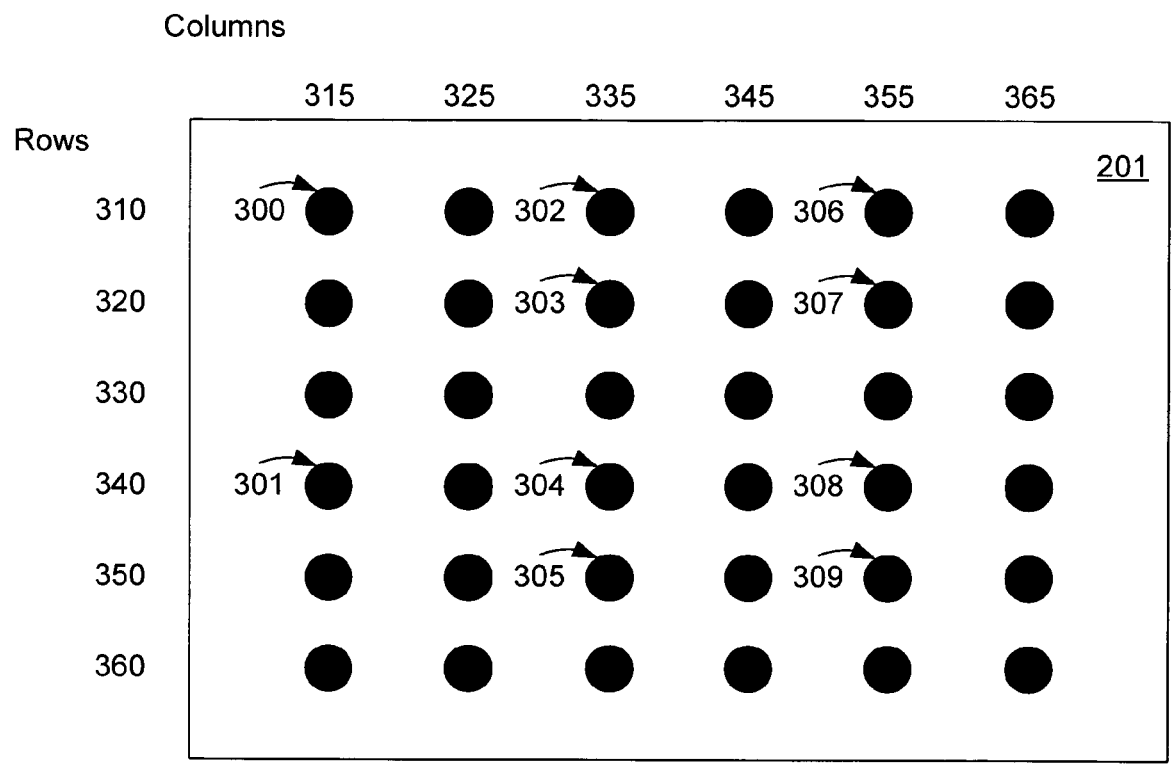
FIG. 3 depicts a top layer of a printed circuit board, in accordance with embodiments.

With reference now to FIG. 3, an illustration of top layer 201 is depicted, in accordance with one embodiment. Top layer 201 is shown as comprising a number of connector pin vias, e.g. vias 300 through 309, arranged in a series of rows, e.g., rows 310 through 360, and columns, e.g., columns 315 through 365. As shown, top layer 201 is clear of copper around the connector pin vias. In some embodiments, these connector pin vias pass through multiple layers of PCB 200.

Figure 4:
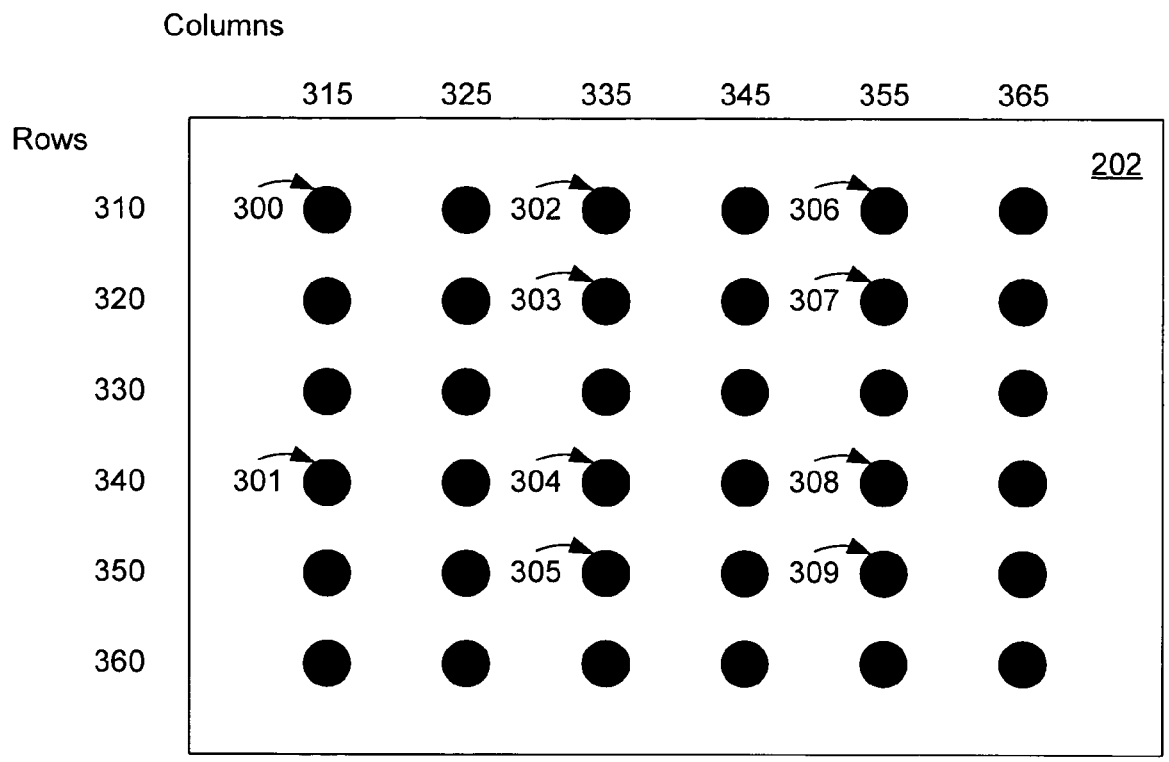
FIG. 4 depicts a power layer of a printed circuit board, in accordance with embodiments.

With reference now to FIG. 4, an illustration of power layer 202 is depicted, in accordance with one embodiment. As shown, power layer 202 is clear of copper around the connector pin vias.

Figure 5:
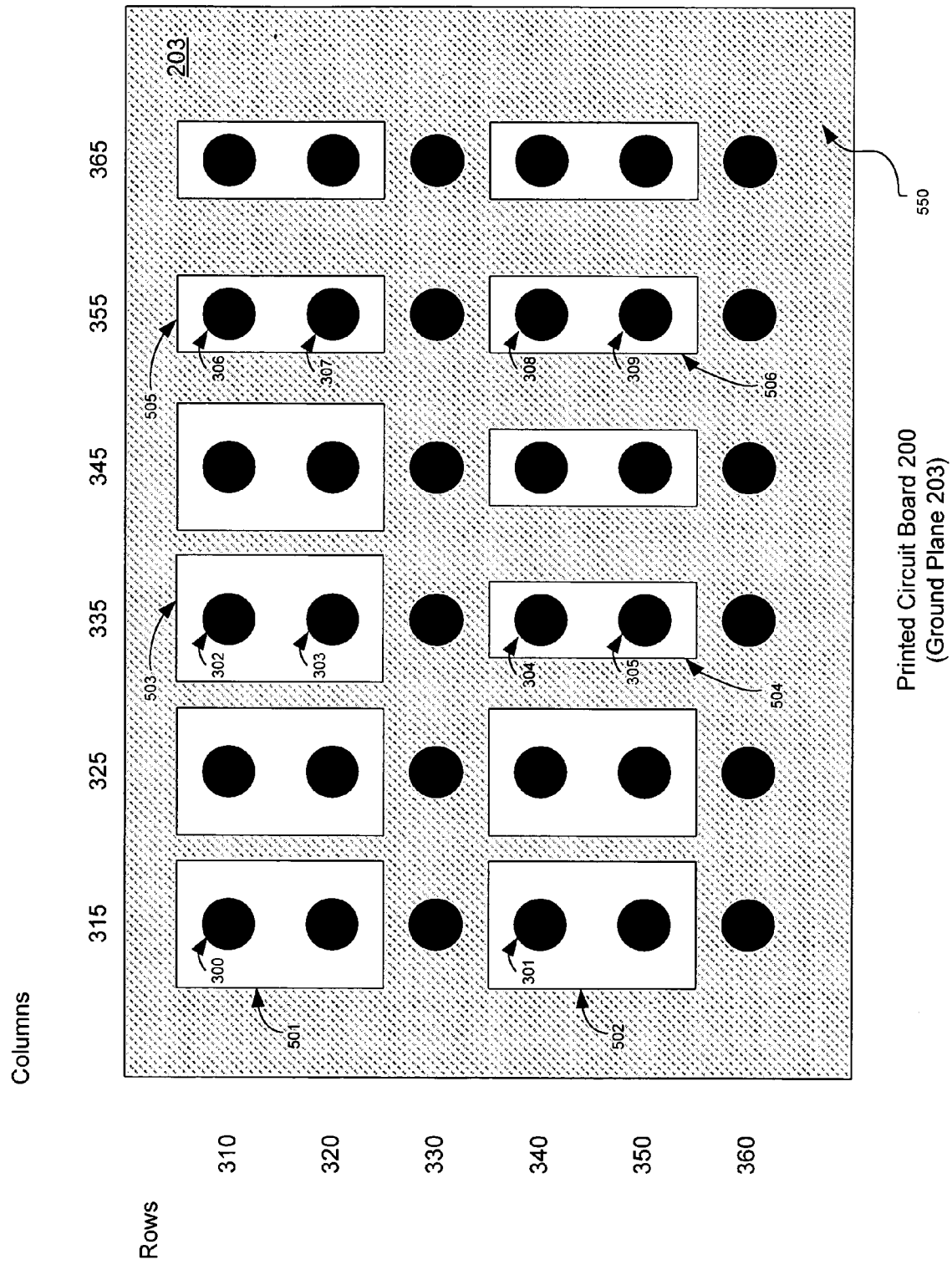
FIG. 5 depicts a first ground plane of a printed circuit board, in accordance with embodiments.

With reference now to FIG. 5, an illustration of ground plane 203 is depicted, in accordance with one embodiment. Ground plane 203 is shown as comprising a number of antipads, e.g., areas clear of copper, around several of the connector pin vias. The remaining portion of ground plane 203, shown as shaded region 550, is not clear of copper, in the depicted embodiment. A number of connector pin vias, e.g., those lying in rows 330 and 360, do not have antipads; in the depicted embodiment, these vias are ground reference.

The antipads depicted as part of ground layer 203 are shown as having two different sizes. Some, e.g., antipads 501, 502, and 503, are larger than others, e.g., antipads 504, 505, and 506. As explained in greater detail below, the size of the antipad can be adaptively selected during layout, depending on the location of signal traces in adjacent signal layers.

It is understood that the shape, size, and positioning of the antipads depicted as part of ground layer 203 are intended as exemplary only. For example, circular antipads may be used, rather than the rectangular antipads shown. In some embodiments, a consideration in selecting a size and shape for an antipad is to maximize clearance around the via, while not affecting nearby signal traces or other components. In other embodiments, other considerations may apply as well.

Figure 6:
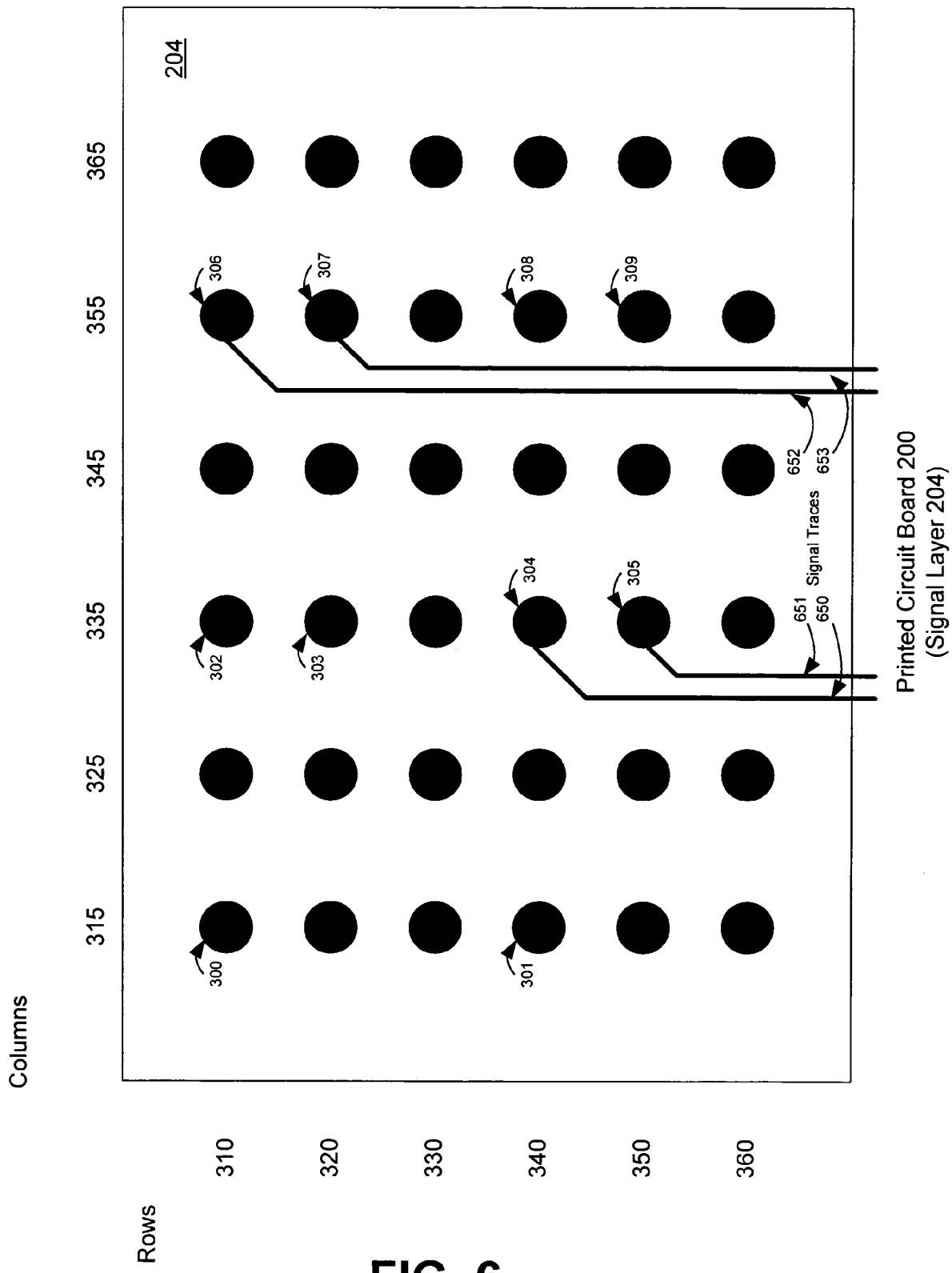
FIG. 6 depicts a signal layer of a printed circuit board, in accordance with embodiments.

With reference now FIG. 6, an illustration of signal layer 204 is depicted, in accordance with one embodiment. Signal layer 204 is shown as comprising a number of signal traces 650, 651, 652, and 653, running to selected connector pin vias.

Figure 7:
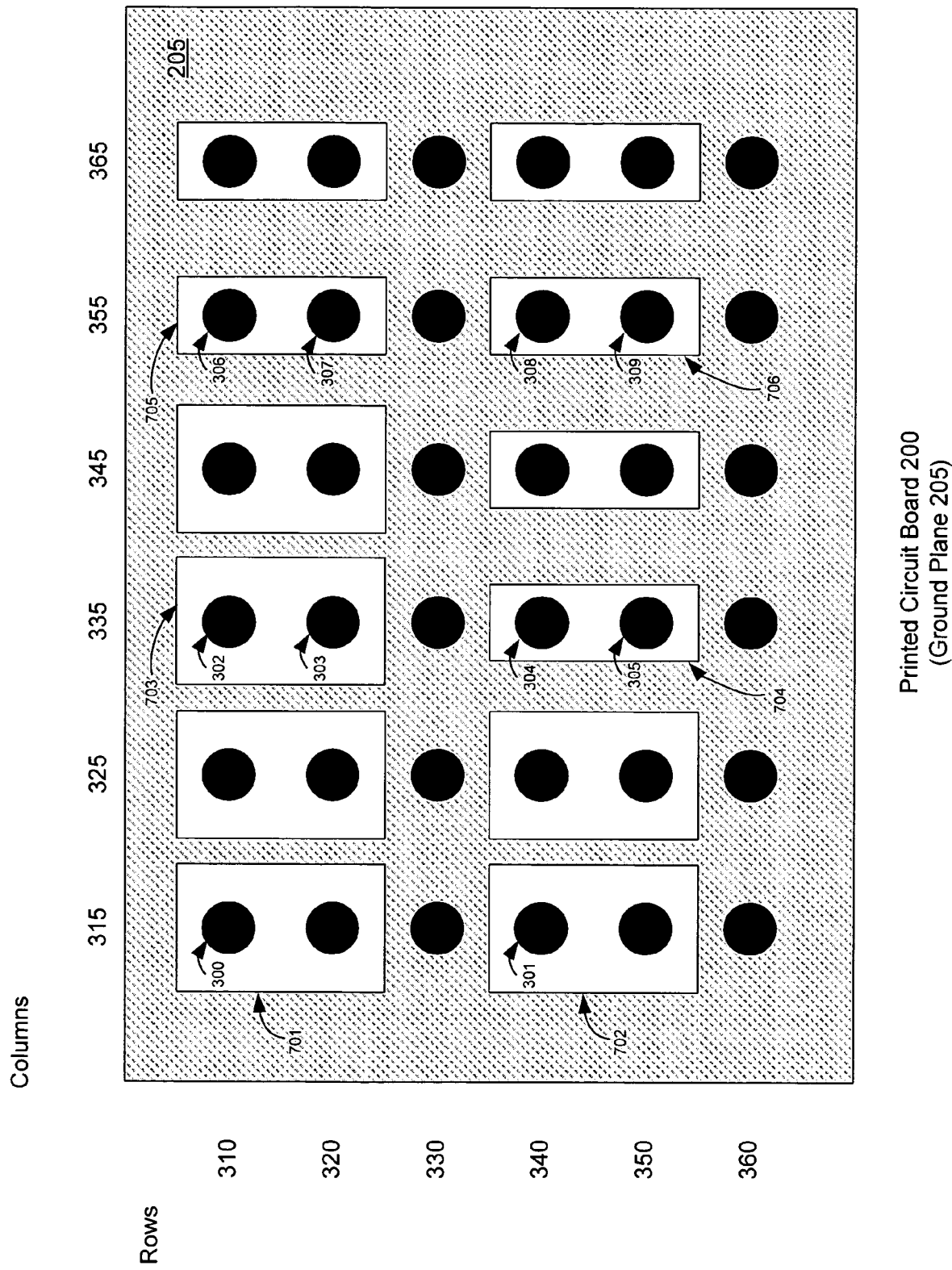
FIG. 7 depicts a second ground plane of a printed circuit board, in accordance with embodiments.

With reference now to FIG. 7, an illustration of ground plane 205 is depicted, in accordance with one embodiment. Ground plane 205 is shown as mirroring ground plane 203, in this embodiment. In other embodiments, such as those where PCB 200 comprises an additional signal layer with signal traces adjacent to ground plane 205, ground plane 205 may comprise different sized antipads than those of ground plane 203.

With reference to FIGS. 5, 6, and 7, the positioning of the signal traces on signal layer 204 affects the size of the antipads used in ground planes 203 and 205. For example, no signal traces run to connector pin vias 300 or 301 on signal layer 204; accordingly, the antipads around these connector pin vias on the adjacent ground planes, namely antipads 501, 502, 701, and 702, can be correspondingly large.

Signal traces 650 and 651 run to connector pin vias 304 and 305. Accordingly, it is desirable that antipads 504 and 704 be smaller, so as to a provide a ground reference above and below the signal traces. However, antipads 503 and 703 can be larger, as the signal traces connecting to vias 304 and 305 do not run past connector pin vias 302 and 303.

Signal traces 652 and 653 run to connector pin vias 306 and 307. Accordingly, is desirable that that antipads 505 and 705 be smaller, again so as to provide a ground reference above and below the signal traces. Antipads 506 and 706 may also be smaller; while no signal traces run to connector pin vias 308 and 309, a larger antipad would interfere with signal traces 652 and 653. If a larger antipad size were used around connector pin vias 306 and 307, signal traces 652 and 653 would lack a ground reference above and below the signal traces for at least a portion of their path.

In some embodiments, including several with multiple signal layers in the printed circuit board, it is possible for the size of the antipads associated with a particular connector pin via to vary across different layers of the printed circuit board. For any given ground plane, and any particular antipad, the determination of what sized antipad to use is made depending on signal traces in an adjacent signal layer or layers. For example, if PCB 200 included an additional signal layer, positioned below ground plane 205, the determination of an appropriate antipad size to use on adjacent ground planes would depend on the absence or presence of signal traces on all adjacent signal layers. Antipads used on ground plane 205 would be selected with reference to both signal layer 204 and the additional signal layer; antipads used on an additional ground plane below the additional signal layer would be selected with reference to the additional signal layer.

Method of Adaptively Laying out a Printed Circuit Board

Figure 8:
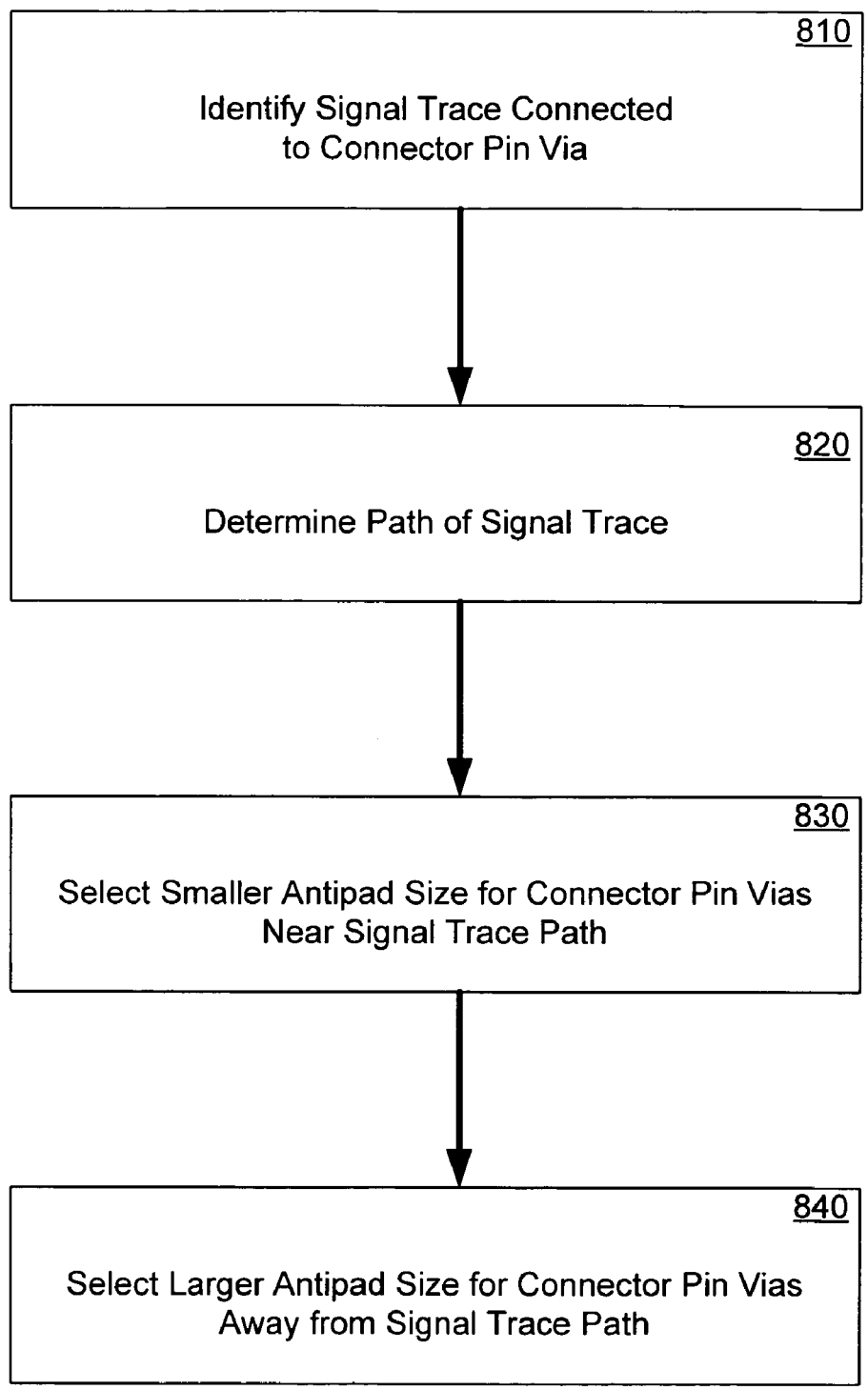
FIG. 8 depicts a flowchart of a method of adaptively laying out a printed circuit board, in accordance with embodiments.

With reference now to FIG. 8, a flowchart 800 of a method of adaptively laying out a printed circuit board is depicted, in accordance with one embodiment. Although specific functions are disclosed in flowchart 800, such functions are exemplary. That is, embodiments of the present invention are well suited to performing various other (additional) functions or variations of the functions recited in flowchart 800. It is appreciated that the functions in flowchart 800 may be performed in an order different than presented, and that not all of the functions in flowchart 800 may be performed.

With reference now to block 810, in some embodiments a signal trace coupled to a connector pin via on a signal layer of a multilayer printed circuit board is identified. In some embodiments, this could be accomplished manually, e.g., a designer examines a layout geometry for a printed circuit board, and locates where a signal trace connects to a connector pin via on a signal layer. In other embodiments, this operation could be performed by layout design software, e.g., after layout design software has been used to design a PCB, the software examines the resultant design to identify where a signal trace connects to a connector pin via on a signal layer.

For example, with reference to PCB 200, signal trace 653 is connected to connector pin via 307 on signal layer 204.

At block 820, the path of the signal trace along the signal layer is determined. In some embodiments, this operation can be performed by a user, e.g., a user examines the layout geometry, and determines where the signal path runs. In other embodiments, this operation can be automated, e.g., the layout software used to design the layout geometry can determine the path of the signal trace. In some embodiments where this function is performed, a purpose of this function is to determine how close a signal trace will pass to nearby connector pin vias. In such embodiments, it is desirable to have the ground plane above and/or below the signal trace available as a reference. In such a situation, knowing where the signal trace runs along the signal layer allows selection of antipads on the ground planes for nearby connector pin vias, such that the signal trace does not pass under or over an antipad.

Continuing the example, with reference to PCB 200, signal trace 653 has a path such that it passes near connector pin vias 308 and 309.

At block 830, an antipad of a first size is selected for use in conjunction with the connector pin via connected to the signal trace on an adjacent ground plane. In some embodiments, the layout geometry would be designed with a smaller antipad around the connector pin via connected to the signal trace, on the adjacent ground plane or planes. In further embodiments, this also extends to selecting antipads for connector pin vias which are near to or adjacent to the signal trace path, such that the antipads for these connector pin vias do not interfere with the signal trace.

Continuing the example, with reference to PCB 200, antipad 505, on ground plane 203, is of a size selected to prevent undesirable interference with signal trace 653. Additionally, antipad 506, on ground plane 203, is also of a size selected to prevent undesirable interference with signal trace 653. Similarly, antipads 705 and 706 are of a size selected to prevent undesirable interference with signal trace 653.

With reference now to function 840, an antipad of a second size is selected for use in conjunction with a connector pin via unrelated to the signal trace path. In some embodiments, this function entails utilizing larger antipads around connector pin vias, when those larger antipads will not interfere with a signal trace path. In this way, the parasitic capacitance of the connector pin via can be reduced; smaller antipads are used where a larger antipad would interfere with a signal trace, while larger antipads can be used where they will not interfere with a signal trace.

With reference to PCB 200, antipads 501, 502, 503, 701, 702, and 703 can be larger antipads, as no signal traces run near enough of for the larger antipads to interfere.

It is understood that while the method described is presented in terms of choosing between two sizes of antipads, embodiments are well suited to applications involving multiple sizes and/or shapes of antipads.

It is also understood that while the method described can be performed manually, embodiments are similarly well suited to applications involving automation of one or more functions of the method, e.g., a designer could manually create a layout geometry for a PCB according to the method presented, or PCB design layout software can incorporate one or more of the functions of the method as an automated tool.

Further, it is also understood that while the method described is presented in terms of antipads for a ground plane, embodiments are well suited to other applications, e.g., antipads on a power layer.

Embodiments of the present invention are thus described. While the present invention has been described in particular embodiments, it should be appreciated that the present invention should not be construed as limited by such embodiments, but rather construed according to the following claims.

What is claimed is:

1. A multilayer circuit design apparatus comprising:
processing circuitry configured to access a layout of a first layer of a plurality of layers of a multilayer circuit which comprises a plurality of vias in the layers, to provide a plurality of antipads in a second of the layers for respective ones of the vias, and to use a path of a trace of the first layer to select a plurality of different sizes for the antipads in the second of the layers wherein a plurality of the antipads which are immediately adjacent to opposite sides of the path of the trace have a reduced size compared with others of the antipads which are not immediately adjacent to the path of the trace.

2. The apparatus of claim 1 wherein the processing circuitry is configured to provide the antipads to not extend elevationally over or under the path of the trace.

3. The apparatus of claim 1 wherein the trace is electrically coupled with one of the vias, and wherein the processing circuitry is configured to use the path of the trace to select a size of one of the antipads for another of the vias which is not electrically coupled with the trace.

4. The apparatus of claim 1 wherein the processing circuitry is configured to design a layout for a third of the layers of the multilayer circuit including an antipad for one of the vias and having a size different than a size of one of the antipads of the second of the layers for the one of the vias.

5. The apparatus of claim 1 wherein the path of the trace extends between the plurality of antipads which have the reduced size in a direction orthogonal to a line between the plurality of antipads which have the reduced size.

6. The apparatus of claim 1 wherein the plurality of antipads which have the reduced size are not coupled with the trace.

7. A computer-usable medium having computer-readable program code embodied therein for causing a computer system to perform processing comprising:
providing a plurality of layouts for a plurality of layers of a multilayer circuit, the layouts comprising a plurality of vias; and
wherein the providing a layout for a first of the layers of the multilayer circuit comprises:
identifying a path of a trace in a second of the layers of the multilayer circuit; and
using the path of the trace, selecting a plurality of different sizes of antipads for respective ones of the vias in the layout for the first of the layers of the multilayer circuit, wherein the path of the trace extends between a pair of the antipads which are immediately adjacent to the path of the trace in a direction orthogonal to a line between the pair of antipads and the selecting comprises selecting the antipads of the pair to have reduced sizes compared with others of the antipads which are not immediately adjacent to the path of the trace.

8. The medium of claim 7 wherein the selecting comprises selecting the different sizes of the antipads such that the antipads do not extend elevationally over or under the path of the trace.

9. The medium of claim 7 wherein the selecting comprises selecting the different sizes of the antipads such that conductive material of the first of the layers is elevationally over or under the path of the trace.

10. The medium of claim 7 wherein the providing comprises providing a layout for a third of the layers of the multilayer circuit comprising providing an antipad in the third of the layers for one of the vias and having a size different than a size of one of the antipads in the first of the layers for the one of the vias.

* * * * *